United States Patent [19]
Bruni et al.

[11] 3,988,802
[45] Nov. 2, 1976

[54] RETRACTABLE HANDLE ASSEMBLY

[75] Inventors: James G. Bruni, Manhattan Beach; John W. Goodin, Long Beach, both of Calif.

[73] Assignee: Baxter Laboratories, Inc., Deerfield, Ill.

[22] Filed: July 18, 1975

[21] Appl. No.: 596,949

[52] U.S. Cl. .................................. 16/115; 16/112; 312/320; 220/94 R; 224/46 T
[51] Int. Cl.² .......................................... A47B 95/02
[58] Field of Search .............. 220/96, 94 R; 16/112, 16/115; 312/244, 320; 224/46 T, 48 R, 48 D

[56] References Cited
UNITED STATES PATENTS

| | | | |
|---|---|---|---|
| 2,885,819 | 5/1959 | Newell et al. | 43/55 |
| 2,944,864 | 7/1960 | Krivulka | 312/320 |
| 3,120,412 | 2/1964 | Caldwell | 312/320 |
| 3,224,790 | 12/1965 | Holstein | 16/115 X |
| 3,279,875 | 10/1966 | Dewitte, Jr. | 312/320 |
| 3,284,151 | 11/1966 | Morrison et al. | 312/244 |

Primary Examiner—Andrew V. Kundrat
Attorney, Agent, or Firm—Eugene M. Cummings; Richard G. Kinney

[57] ABSTRACT

A retractable handle assembly for an equipment housing includes a generally U-shaped handle. The side members of the handle are slidably mounted to the housing by means of guide pins which ride in elongated slots on mounting blocks attached to the housing. A communicating slot on the mounting block allows the handle when fully extended to pivot about the guide pins away from an underlying surface so as to be more easily grasped. When retracted the handle is flush with the side panels of the housing.

9 Claims, 6 Drawing Figures

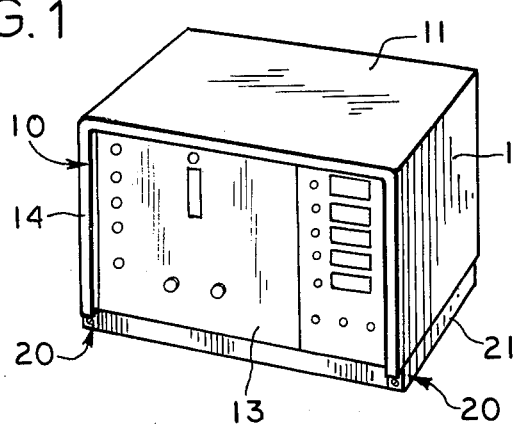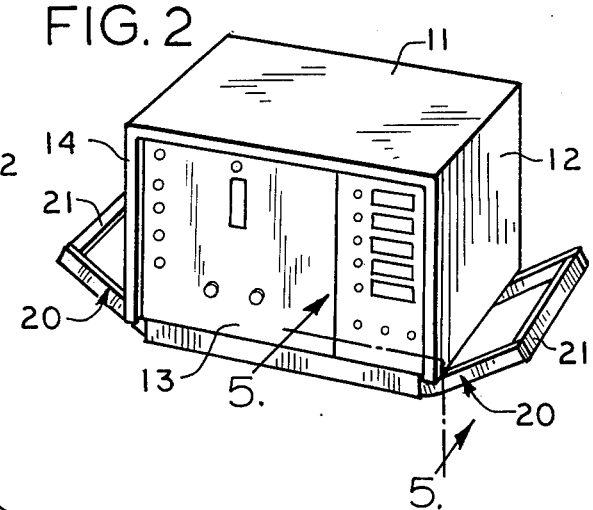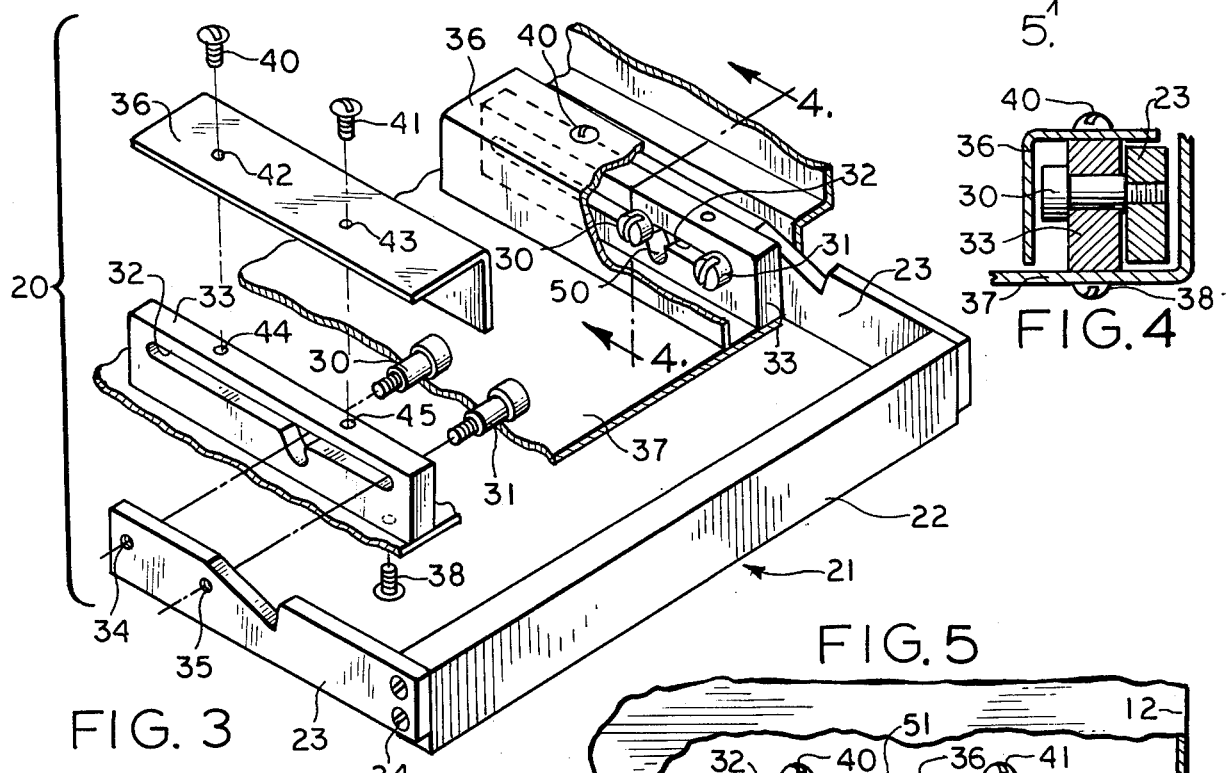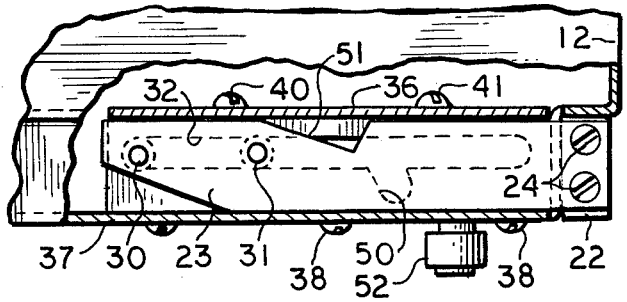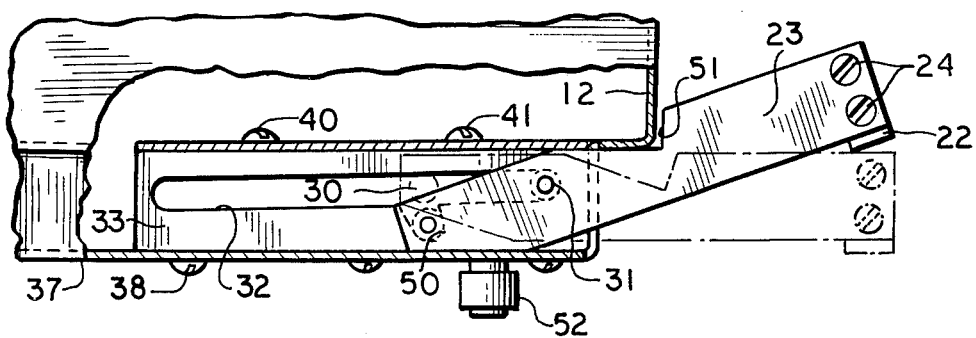

RETRACTABLE HANDLE ASSEMBLY

BACKGROUND OF THE INVENTION

This invention relates generally to equipment housings, and more particularly to a retractable handle assembly for use in conjunction with an equipment housing wherein in its retractable position the handle is stored flush with the housing, and in its extended position is positioned for convenient lifting of the equipment housing clear of an underlying surface.

Electronic equipment, such as test instruments and various types of medical instruments, must often be carried from one location to another. In order to facilitate movement of such equipment the equipment is preferably provided with handles which can be grasped to lift the equipment clear of an underlying surface and to support the equipment as it is conveyed to another location. However, such handles are preferably removable or capable of being retracted when not in use in order to eliminate the danger of inadvertent contact with the protruding handles, as well as to facilitate placement of the equipment in confined spaces.

The above problems are particularly significant in the medical electronics field, wherein it is necessary to frequently move sophisticated electronic equipment from one location to another, as when disconnecting the equipment from one patient and connecting it to another. Furthermore, in the environment of a hospital the equipment must often be operated in confined areas, so that the existence of protruding handles must be avoided.

SUMMARY OF THE INVENTION

The invention is directed to a retractable handle assembly for use in conjunction with a housing. The handle assembly comprises a generally U-shaped handle including a grippable member and a pair of side members attached to respective ends of the grippable member, a pair of handle mounting blocks disposed on the housing adjacent respective ones of the side members, the blocks each including a first slot extending generally parallel to the side members, means including a pair of support pins extending from each of the side members into respective ones of the slots for slidably supporting the handle with respect to the housing, and indexing means including a second slot in each of the mounting blocks intercepting the first slot at a predetermined location for receiving one of the support pins when the handle is fully extended to enable the handle to be pivoted upwardly.

The invention is further directed to an apparatus housing comprising top, bottom and side panel members attached to respective ends of the grippable member, a pair of handle mounting blocks attached to one of the housing panel members adjacent respective ones of the side members, the blocks each including a first slot extending generally parallel to the side members, means including a pair of support pins extending from each of the side members into respective ones of the slots for slidably supporting the handle, and indexing means including a second slot communicating with the first slot for enabling the handle to pivot upwardly away from the side panels when in a fully extended position.

The invention is further directed to a retractable handle assembly for use in conjunction with a housing. The handle assembly includes a generally U-shaped handle including a grippable member and first and second side members attached to respective ends of the grippable member, first and second handle mounting members disposed on the housing adjacent respective ones of the side members, a first one of the first members including a first slot extending generally parallel to the side members and the other of the first members including a pair of support pins slidably engaged within the slot, and a first one of the second members including a first slot extending generally parallel to the side members and the other of the second members including a pair of support pins slidably engaged within the slot, for slidably supporting the handle with respect to the housing, and indexing means including additional slots in each of the first ones of the members intercepting the first slots at a predetermined location for receiving respective ones of the support pins when the handle is fully extended to enable the handle to be pivoted upwardly.

BRIEF DESCRIPTION OF THE DRAWINGS

The features of the present invention, which are believed to be novel, are set forth with particularity in the appended claims. The invention, together with the further objects and advantages thereof, may best be understood by reference to the following description taken in connection with the accompanying drawings, in the several figures of which like reference numerals identify like elements, and in which:

FIG. 1 is a perspective view of an electronic instrument showing the retractable handle assembly of the invention in its retracted position.

FIG. 2 is a perspective view similar to FIG. 1 showing the handle assembly in its extended position.

FIG. 3 is an enlarged exploded view of the principal components of the handle assembly.

FIG. 4 is a cross-sectional view taken along line 4—4 of FIG. 3.

FIG. 5 is an enlarged side elevational view partially broken away to shown the handle assembly in a retracted position.

FIG. 6 is an enlarged side elevational view similar to FIG. 5 showing the handle assembly in an extended position.

DESCRIPTION OF THE PREFERRED EMBODIMENT

Referring to the figures, and particularly to FIGS. 1 and 2, an electrical apparatus housing 10 incorporating a retractable handle assembly constructed in accordance with the invention is seen to comprise a top panel 11, a pair of side panels 12, and a front panel 13. Controls for the apparatus, which in this case is a proportional dialysis machine for use in hospitals and clinics, extend through the front panel; the side panel 12, top panel 11 and bottom panel (not shown) together forming a rectangular housing for the apparatus. A trim strip 14 is attached to the front edges of the top and side panels to give the front panel a more pleasing appearance.

The apparatus housing includes near the bottom edge of its side panels a retractable handle assembly 20. In FIG. 1 this handle assembly is shown retracted, the handle 21 of the assembly being flush with side panel 12. Since in the retracted position the handle is flush with the sides of the housing, no additional space is required for the handle and the equipment can be stored side-by-side with other equipment. In FIG. 2 the handle assembly is shown extended, the handle 21 being positioned outwardly and upwardly away from the underlying surface to facilitate lifting of the apparatus. Handle assemblies are provided on both sides of the housing to facilitate balancing the apparatus as it is carried, or to allow more than one person to assist in carrying the apparatus.

Referring to FIGS. 3 and 4, the handle assembly 20 is seen to consist of a generally U-shaped handle 21 comprising a bar-like grip member 22 and a pair of slat-like side members 23 attached to either end of the grip member. These members are fastened together by machine screws 24, and the side members 23 are slidably mounted to the housing 10 by means of two pairs of guide pins 30 and 31. These guide pins, which may include roller surfaces, extend through appropriately dimensioned slots 32 in a pair of mounting blocks 33 attached to the underside of the housing. The pins 30 and 31 are turned into respective ones of complementarily sized apertures 34 and 35 on the side members, and are arranged one behind the other in the slots so that the guide pins, and hence the side members, are free to slide toward and away from the side panels of the housing while being maintained in a horizontal orientation. The length of slots 32 is such that the U-shaped handle 21 can be stored with the outside surfaces of its grip members 22 flush with the side panels of the housing, as shown in FIG. 1, or at a spaced relationship to the side panels as shown in FIG. 2.

Shields in the form of L-shaped brackets 36 may be fastened over the inside faces of mounting block 33 to shield guide pins 30 and 31 and slot 32 from dust and user contact. For the same reason a bottom plate 37 may be installed over the entire underside of the housing by means of machine screws 28, or other appropriate fastening means. The mounting blocks are fastened to the underside of the housing by means of a pair of machine screws 40 and 41 which extend downwardly through apertures 42 and 43 in bracket 36 and into threaded engagement with apertures 44 and 45 on the mounting block.

Once the handle assembly 20 has been moved to its extended position it is desirable that the grip member 22 be spaced away from the underlying support surface to allow the user to more conveniently pick up the unit. To this end, and in accordance with the invention, mounting block 33 is provided with an additional slot 50 arranged at an angle relative to slot 32 so as to intercept slot 32 at a location approximately one-third the distance between its front and rear ends (as viewed in FIG. 3).

Referring to FIG. 3, when the handle assemblies are in their retracted positions, none of the guide pins 30 or 31 fall in slot 50, and the handles are constrained to a horizontal position. However, when the handles are moved to their extended positions, as shown in FIG. 6, the rearmost guide pins 30 are located at the points where slots 50 intercept slots 32, and are therefore able to move downwardly along these tracks. To allow the projecting portions of the handles to move upwardly as the handles pivot about guide members 31, side members 23 are provided with notches 51 appropriately dimensioned to accommodate the bottom edges of side panels 12. The limited pivotal movement about pins 31 is sufficient to raise the grip members 22 to a location sufficiently spaced from the underlying support surface, thereby allowing the apparatus to be conveniently lifted.

To return the handle assemblies to their retracted positions, the grip bars 22 are pushed downwardly until the handles 21 are horizontal, and then pushed inwardly toward side plates 12 until the top surfaces of the grip members are flush with the side plates as shown in FIG. 5. Although guide pins 31 pass over the intercepts between slots 32 and slots 50 as the handles are being retracted, the portions of the handles still projecting from the housing do not drop by reason of the flat horizontal top surfaces of side members 23 at this time slidably bearing against the horizontal undersurfaces of brackets 36. To prevent the underlying support surface from being marred during use of the apparatus 10, bottom plate 37 of the housing may be provided with a plurality of mounting feet 52 adjacent each corner of the apparatus.

In use it is merely necessary for a user to pull the grip members as far away from the housing side panels as they will go. Then, the handles are pivoted upwardly so that the grip members can be firmly grasped, and the apparatus is lifted from the underlying surface. To return the apparatus housing to its storage configuration, it is merely necessary for the user to push the grip members downwardly until the side members are horizontal, and then to push inwardly on grip members to slide the handles into their retracted positions, as shown in FIG. 1. Thus, the handle assembly of the invention provides a convenient and aesthetically pleasing means for efficiently transporting electrical apparatus. Since the handle assembly requires a minimum number of components, it is economical to manufacture and can be readily added to existing equipment housings.

While the handle assembly 20 is shown located at the bottom of the apparatus housing, it will be appreciated that it could also be located at other locations, including the top portion of the housing. Furthermore, while the handle assemblies are shown as extending from the sides of the equipment housing, they could also be arranged to extend from the front and rear (not shown) of the housing. Also, while the support pins have been shown as extending from the handle side members into slots on the handle mounting blocks, it is contemplated that it would be possible to instead provide support pins on the handle mounting blocks which extend into slots on the handle side members.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

We claim:
1. A retractable handle assembly for use in conjunction with a housing comprising, in combination:
   a generally U-shaped handle including a grippable member and a pair of side members attached to respective ends of said grippable member;
   a pair of handle mounting blocks disposed on said housing adjacent respective ones of said side members, said blocks each including a first slot extending generally parallel to said side members;
   means including a pair of support pins extending from each of said side members into respective ones of said slots for slidably supporting said handle with respect to said housing; and indexing means including a second slot in each of said mounting blocks intercepting said first slot at a predetermined location for receiving one of said support pins when said handle is fully extended to enable said handle to be pivoted upwardly.

2. A retractable handle assembly as defined in claim 1 wherein said support pins are aligned front and rear with respect to said first slots, and wherein said second slots intercept said first slots such that the rear-most of said support pins are received therein as said handle reaches said fully extended position.

3. A retractable handle assembly as defined in claim 2 wherein said side members each include a notch dimensioned to clear the side panels of said housing when said handle assembly is fully extended.

4. An apparatus housing comprising, in combination:
a generally U-shaped handle including a grippable member and a pair of side members attached to respective ends of said grippable member;
top, bottom and side panel members attached to respective ends of said grippable member;
a pair of handle mounting blocks attached to one of said housing panel members adjacent respective ones of said side members, said blocks each including a first slot extending generally parallel to said side members;
means including a pair of support pins extending from each of said side members into respective ones of said slots for slidably supporting said handle; and
indexing means including a second slot communicating with said first slot for enabling said handle to pivot upwardly away from said side panels when in a fully extended position.

5. An apparatus housing as defined in claim 4 wherein said support pins are aligned front and rear with respect to said first slots, and wherein said second slots intercept said first slots such that the rear-most of said support pins are received therein as said handle reaches said fully extended position.

6. An apparatus housing as defined in claim 5 wherein said side members each include a notch dimensioned to clear the side panels of said housing when said handle assembly is fully extended.

7. A retractable handle assembly for use in conjunction with a housing comprising, in combination:
a generally U-shaped handle including a grippable member and first and second side members attached to respective ends of said grippable member;
first and second handle mounting members disposed on said housing adjacent respective ones of said side members, a first one of said first members including a first slot extending generally parallel to said side members and the other of said first members including a pair of support pins slidably engaged within said slot, and a first one of said second members including a first slot extending generally parallel to said side members and the other of said second members including a pair of support pins slidably engaged within said slot, for slidably supporting said handle with respect to said housing; and
indexing means including additional slots in each of said first ones of said members intercepting said first slots at a predetermined location for receiving respective ones of said support pins when said handle is fully extended to enable said handle to be pivoted upwardly.

8. A retractable handle assembly as defined in claim 7 wherein said support pins are aligned front and rear with respect to said first slots, and wherein said additional slots intercept said first slots such that the rear-most of said support pins are received therein as said handle reaches said fully extended position.

9. A retractable handle assembly as defined in claim 8 wherein said side members each includes a notch dimensioned to clear the side panels of said housing when said handle assembly is fully extended.

* * * * *